(12) United States Patent
Huber et al.

(10) Patent No.: US 7,161,368 B2
(45) Date of Patent: Jan. 9, 2007

(54) SEMICONDUCTOR COMPONENT WITH INTERNAL HEATING

(75) Inventors: Thomas Huber, München (DE); Peggy Menck, München (DE); Georg Eggers, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/090,292

(22) Filed: Mar. 28, 2005

(65) Prior Publication Data
US 2005/0218917 A1  Oct. 6, 2005

(30) Foreign Application Priority Data
Mar. 30, 2004 (DE) .................. 10 2004 015 539

(51) Int. Cl.
*G01R 31/02* (2006.01)
*G01R 31/26* (2006.01)
*G01R 7/01* (2006.01)

(52) U.S. Cl. .................. 324/760; 324/158.1; 324/765; 374/183

(58) Field of Classification Search ............... 324/760; 374/183
See application file for complete search history.

(56) References Cited

U.S. PATENT DOCUMENTS

| 5,233,161 A * | 8/1993 | Farwell et al. ............... 219/209 |
| 5,309,090 A | 5/1994 | Lipp |
| 5,639,163 A * | 6/1997 | Davidson et al. ........... 374/178 |
| 6,612,738 B1 * | 9/2003 | Beer et al. .................. 374/183 |
| 6,879,172 B1 * | 4/2005 | Eppes et al. ................ 324/760 |
| 2003/0165306 A1 | 9/2003 | Ilda et al. |
| 2004/0150417 A1 * | 8/2004 | Paulos ......................... 324/760 |
| 2004/0211769 A1 * | 10/2004 | Merk et al. ................. 219/494 |

FOREIGN PATENT DOCUMENTS

EP  0865084  * 9/1998

* cited by examiner

*Primary Examiner*—Vinh Nguyen
*Assistant Examiner*—Emily Y Chan
(74) *Attorney, Agent, or Firm*—Morrison & Foerster LLP

(57) ABSTRACT

The invention involves a process for heating a semi-conductor component, as well as a semi-conductor component, whereby a device for heating the semi-conductor component is provided on the semi-conductor component.

12 Claims, 4 Drawing Sheets

SEMICONDUCTOR COMPONENT WITH INTERNAL HEATING

CLAIM FOR PRIORITY

This application claims priority to German Application No. 10 2004 015 539.9, filed Mar. 30, 2004, which is incorporated herein, in its entirety, by reference.

TECHNICAL FIELD OF THE INVENTION

The invention relates to a semiconductor component with internal heating.

BACKGROUND OF THE INVENTION

Semi-conductor components, for instance corresponding integrated (analog and/or digital) computing circuitry, semi-conductor memory components such as for instance function storage components (PLAs, PALs, etc.) and table storage components (for instance ROMs or RAMs, in particular SRAMs and DRAMs), etc. are subjected to numerous tests during and after manufacture.

For instance components (semi-complete and still on the wafer) may be, at one or more stations and with the aid of one or more test apparatuses—even before the wafer has been subjected to all required process steps (i.e. even while the semi-conductor components are still in a semi-complete state)—subjected to appropriate test procedures (for instance so-called kerf measurements on the wafer scoring grid).

After completion (i.e. after all the wafer processing steps have been performed) the semi-conductor components can be subjected to further test procedures at one or more (further) test stations, for instance the components still present on the wafer and completed may be appropriately tested ("slice tests") with the aid of corresponding (further) test equipment.

After the wafer has been sliced (and/or scored and snapped off) the—now individually available components, loaded into so-called carriers (packages)—can be subjected to further test procedures at one or more (further) test stations.

In similar fashion, one or more further tests can be performed (at corresponding further test stations and by using appropriate further test equipment) for instance after the semi-conductor components have been installed in a corresponding semi-conductor component housing, and/or for instance after the semi-conductor component housings (with the semi-conductor components built into them in each case) have been installed in corresponding electronic modules (for so-called module tests), etc.

To ensure that semi-conductor components can function faultlessly within the total specified temperature range (for instance 0° C.–70° C.), the semi-conductor components may—before and/or during one or more of the above tests (for instance the above slice tests, carrier tests, module tests, etc.)—be appropriately heated or cooled in appropriate heating chambers.

The problem that occurs is that relatively strong non-homogeneous temperature distributions may occur in sections of the heating chamber.

This may for instance have the effect—for instance during a module test—that the most strongly heated semi-conductor component of an electronic module which has been introduced into the heating chamber may be heated relatively strongly, for instance 10° C. more than the least strongly heated semi-conductor component in one and the same module in the heating chamber.

This may lead thereto that one or more of the semi-conductor components in the heating chamber is heated too strongly (for instance above and/or far above the specified temperature in each case, or the target temperature), i.e. is "over-tested".

Thereby the corresponding semi-conductor component may be irreparably damaged and/or destroyed.

In this way the targeted yield (i.e. the proportion of faultlessly operating semi-conductor components/modules) of all the semi-conductor components and/or modules being manufactured is reduced.

When an attempt is made to avoid the above "over-testing"—i.e. the excessive overheating—of those semi-conductor components which are arranged on each module and heated too strongly in the heating chamber due to the non-homogeneous temperature distribution occurring in the heating chambers, it may occur that the remaining semi-conductor components provided on the corresponding module in the heating chamber may not be heated strongly enough.

This may lead to a deterioration in the quality of the produced components and/or modules (because the danger increases that components and/or modules are produced that do not function faultlessly over the whole specified temperature range in each case).

SUMMARY OF THE INVENTION

The invention discloses a semi-conductor component as well as a novel system, which comprises a semi-conductor component and a device provided outside the semi-conductor component, and a new process for heating a semi-conductor component.

In one embodiment of the invention, a semi-conductor component is made available, in which a device for heating the semi-conductor component is provided on the semi-conductor component itself.

Advantageously, the device for heating the semi-conductor component—provided on the semi-conductor component—comprises a control and/or regulatory device.

Preferably the device for heating the semi-conductor component may comprise a heating element, which can be heated by the current flowing through the heating element.

Particularly advantageously, the heating element is a diode, in particular an ESD protective diode.

BRIEF DESCRIPTION OF THE DRAWINGS

The invention is described in more detail with reference to various exemplary embodiments and the attached illustrations. In the illustrations.

DETAILED DESCRIPTION OF THE INVENTION

Figure 1A:
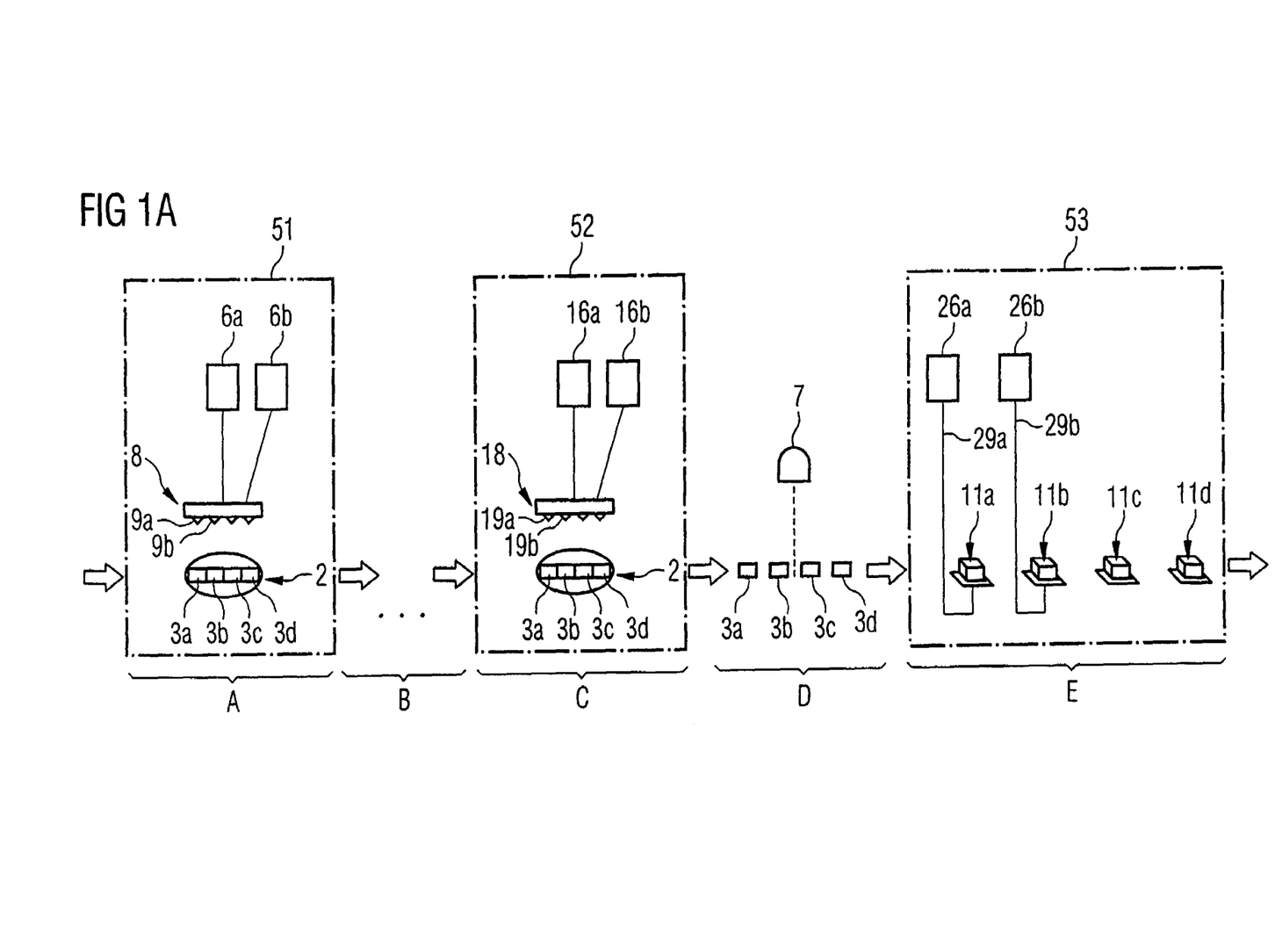
FIG. 1a shows several stations passed through during the manufacture of corresponding semiconductor components used for testing and/or heating corresponding semiconductor components and several heating chambers.
Figure 1B:
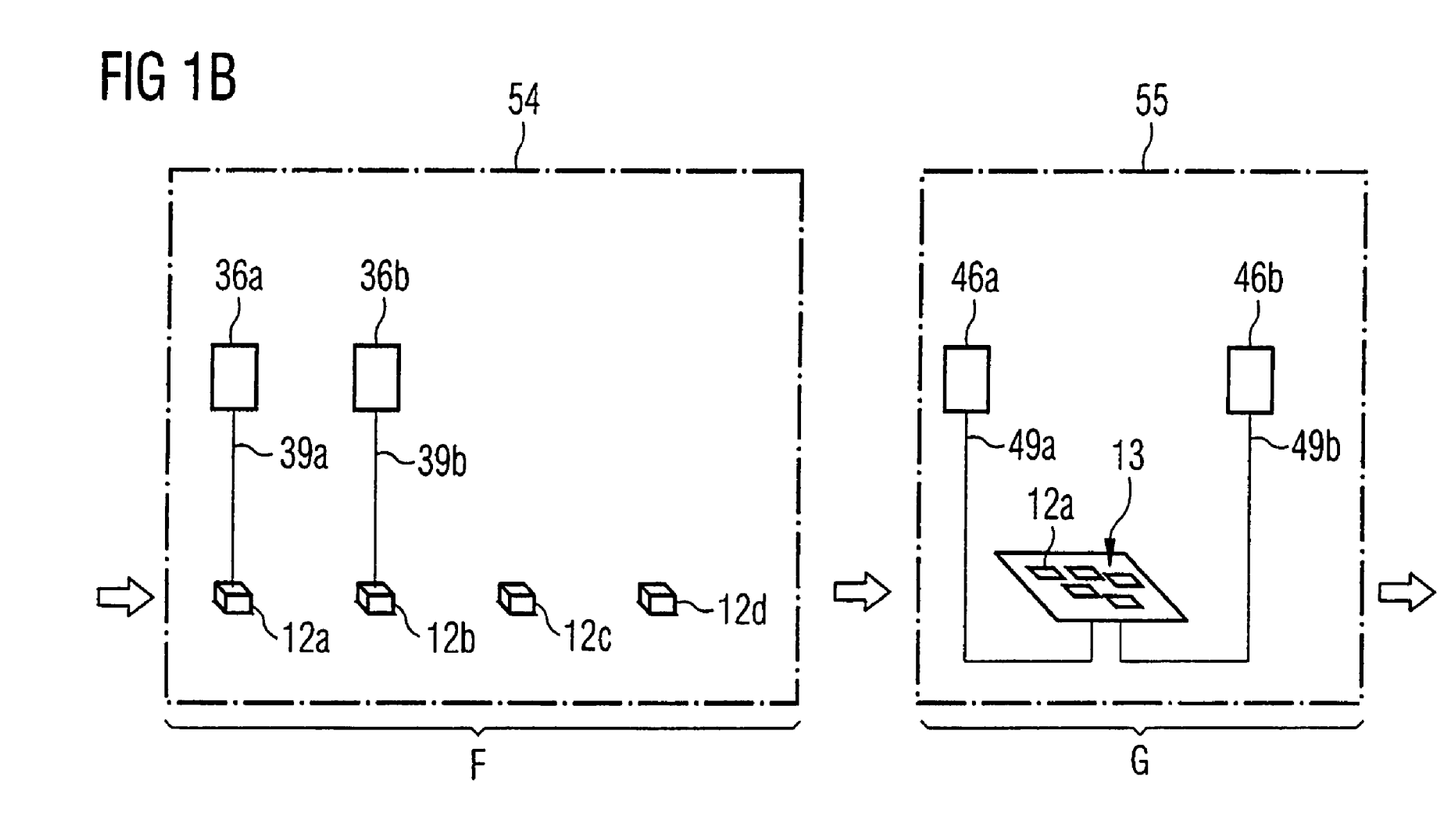
FIG. 1b shows additional stations passed through during the manufacture of corresponding semiconductor components used for testing and/or heating corresponding semiconductor components and heating chambers.

In FIGS. 1a and 1b, a few stations (some of numerous further stations A, B, C, D, E, F, G not shown here) passed through during the manufacture of semi-conductor components 3a, 3b, 3c, 3d (and/or electronic modules) by the corresponding semi-conductor components 3a, 3b, 3c, 3d are shown schematically.

The semi-conductor components 3a, 3b, 3c, 3d may for instance be corresponding integrated (analog and/or digital) computing circuitry, and/or semi-conductor memory components such as for instance function storage components (PLAs, PALs, etc.) or table storage components (for instance ROMs or RAMs), in particular SRAMs or DRAMs (here for instance DRAMs (Dynamic Random Access Memories and/or dynamic read-write memories) with double data rate (DDR-DRAMs=Double Data Rate DRAMs), preferably high-speed DDR-DRAMs).

During the manufacture of the semi-conductor components 3a, 3b, 3c, 3d, a suitable silicon disk and/or corresponding wafer 2 is subjected—for instance at stations upstream and downstream from station A shown in FIG. 1 (for instance station B—downstream from station A—as well as numerous further stations, not shown here (stations both upstream and downstream from station A))—to appropriate conventional coating, illuminating, etching, diffusion and implantation process steps etc.

Station A serves—as is more clearly described below—to heat—in a controlled fashion—the semi-conductor components 3a, 3b, 3c, 3d—still present on wafer 2—by means of several, for instance two or more, control devices 6a, 6b (or alternatively for instance by means of an appropriate single control device) and by means of an internal heating control device 50, 50'—more closely described below—present on the relevant semi-conductor component or provided externally—and/or to subject them to several further test procedures (in fact—as is evident from the explanations above—even before the above processing steps required for wafer 2 have been performed (i.e. already in a semi-completed state of the semi-conductor components 3a, 3b, 3c, 3d)).

Alternatively—as is schematically represented in FIG. 1a—an appropriate heating chamber 51 (into which the above wafer 2, a probe card 8, and for instance the devices 6a, 6b may be placed (or for instance the wafer 2, or for instance the wafer 2 and the probe card 8, not however the devices 6a, 6b, etc.)) may be additionally provided to assist with the above heating procedure of the semi-conductor components 3a, 3b, 3c, 3d, before, and/or during one or several of the above tests.

The voltages/currents and/or test signals required—as is more clearly described further below—for heating the semi-conductor components 3a, 3b, 3c, 3d at station A by means of the above internal heating control devices 50, 50' (and/or for testing a corresponding semi-conductor component 3a on wafer 2)—are generated by the corresponding devices 6a, 6b and relayed by means of the probe card 8 connected to the devices 6a, 6b (more accurately: by means of corresponding contact pins 9a, 9b provided on the probe card) to corresponding connections on the relevant semi-conductor component 3a.

From station A the wafer 2 may (in particular fully automatically) be further transported to station B (and from there—if required—to numerous stations not represented here), where—as already mentioned above—wafer 2 is subjected to appropriate further processing steps (in particular to appropriate coating, illuminating, etching, diffusion and implantation process steps etc.) and/or—correspondingly similar to those performed at station A—to further heating and/or test procedures.

After the semi-conductor components have been completed (i.e. after the above wafer processing steps have been performed) wafer 2 is transported—in particular in fully automatic fashion—from the corresponding—previous—processing station (for instance from station B or other further—downstream—stations) to the next station C.

Station C may still—as is more clearly described further below—be used for the controlled heating of the completed semi-conductor components 3a, 3b, 3c, 3d—still present on wafer 2—by means of several, for instance two or more control devices 16a, 16b (or alternatively for instance by means of a corresponding single control device), and by the above internal heating control device 50, 50'—present on each semi-conductor component or provided externally—and/or to subject it to various—further—test procedures, for instance to so-called slice tests.

As an alternative, an appropriate (additional) heating chamber 52 (into which—as is schematically represented in FIG. 1a—the above wafer 2, a probe card 18, and for instance the devices 16a, 16b may be placed (or for instance the wafer 2, or for instance the wafer 2 and the probe card 8, not however the devices 6a, 6b, etc.)) may be additionally provided to support the heating process of the semi-conductor components 3a, 3b, 3c, 3d before, and/or during one or several of the above tests.

The voltages/currents and/or test signals required—as is more clearly described further below—for heating the semi-conductor components 3a, 3b, 3c, 3d at station C by means of the above internal heating control device 50, 50' (and/or for testing a corresponding semi-conductor component 3a on wafer 2)—are generated by the corresponding devices 16a, 16b and relayed by means of the probe card 18 connected to the devices 16a, 16b (more accurately: by means of corresponding contact pins 19a, 19b provided on the probe card) to corresponding connections on the relevant semi-conductor component 3a.

From station C wafer 2 is transported (in particular in fully automatic fashion) to the next station D where (after wafer 2 has had foil glued to it in recognized fashion) it is sawn up by an appropriate machine 7 (or for instance scored and snapped off), so that the semi-conductor components 3a, 3b, 3c, 3d become—individually—available.

After wafer 2 has been sawn up at station D, each individual component 3a, 3b, 3c, 3d is then (in particular—again fully automatically) loaded into an appropriate carrier 11a, 11b, 11c, 11d and/or a corresponding container 11a, 11b, 11c, 11d and the semi-conductor components 3a, 3b, 3c, 3d—loaded into the carrier 11a, 11b, 11c, 11d—transported further to one or more (further) stations—for instance to station E shown in FIG. 1a.

At station E the semi-conductor components 3a, 3b, 3c, 3d—loaded into the carriers 11a, 11b, 11c, 11d—can then be heated (in a controlled fashion) for instance by using the above internal heating control device 50, 50'—present on the relevant semi-conductor component, or provided externally (and/or subjected to various further test procedures—for instance to so-called carrier tests).

For this, a corresponding carrier 11a is inserted into an appropriate carrier socket and/or carrier adapter—connected via corresponding lines 29a, 29b with several, for instance two or more control devices 26a, 26b (or alternatively for instance with a corresponding single control device)- and the other carriers 11b, 11c, 11d are for instance similarly inserted into further carrier sockets and/or carrier adapters—or connected to the above control devices or further control devices (not shown here).

The voltages/currents and/or test signals required at station E for heating the semi-conductor components 3a, 3b, 3c, 3d by using the above internal heating control device 50, 50' (and/or for testing a corresponding semi-conductor component 3a in the corresponding carrier 11a) are—as is more clearly described below—generated by the above control devices 26a, 26b and relayed—via lines 29a, 29b, the carrier sockets connected to them, and the carrier 11a—to corresponding connections of the corresponding semi-conductor component 3a.

As an alternative, an appropriate (additional) heating chamber 53 (into which—as is schematically represented in FIG. 1a—the above carriers 11a, 11b, 11c, 11d with their sockets, the components 3a, 3b, 3c, 3d, and the devices 26a, 26b (or for instance the carriers 11a, 11b, 11c and 11d with their carrier sockets, and the components 3a, 3b, 3c, 3d, not however the devices 26a, 26b, etc.) may be additionally provided to support the heating process of the semi-conductor components 3a, 3b, 3c, 3d at station E, before and/or during any one or several of the above tests.

From station E the semi-conductor components 3a, 3b, 3c, 3d may be transported (in particular in fully automatic fashion) to one or more station(s)—not represented here—where the semi-conductor components 3a, 3b, 3c, 3d are mounted on corresponding housings 12a, 12b, 12c, 12d (for instance appropriate plug-in or surface mounted component housings, etc.).

As shown in FIG. 1b, the semi-conductor components 3a, 3b, 3c, 3d—mounted in the housings 12a, 12b, 12c, 12d—may then be transported to one (or more) further stations, for instance to station F shown in FIG. 1b.

At station F the semi-conductor components 3a, 3b, 3c, 3d—mounted in the housings 12a, 12b, 12c, 12d can then be heated (in a controlled way, for instance by using the above internal heating control devices 50, 50'—mounted on the relevant semi-conductor component—or provided externally) and/or subjected to various further test procedures.

For this, a corresponding semi-conductor component housing 12a is inserted into a corresponding component housing socket and/or component housing adapter—connected via corresponding lines 39a with a suitable control device 36a—(and the remaining semi-conductor component housings 12b, 12c, 12d correspondingly inserted into a further component housing socket and/or component housing adapter connected to further control devices 36b).

The voltages/currents and/or test signals required at station F for heating a corresponding semi-conductor component 3a—mounted in an appropriate housing 12a—by using the above internal heating control device 50, 50' (and/or for testing the corresponding semi-conductor component 3a)—as is more clearly described further below—are generated by the above control devices 36a, 36b and relayed via lines 39a, 39b connected with the corresponding control device 36a, 36b housing socket and the housing 12a connected to it, to corresponding connections of the relevant semi-conductor component 3a.

As an alternative, an appropriate (additional) heating chamber 54 (into which—as is schematically represented in FIG. 1a—the above housings 12a, 12b, 12c, 12d with their components 3a, 3b, 3c, 3d, and the devices 36a, 36b may be inserted (or for instance only the carriers 12a, 12b, 12c and 12d with their components 3a, 3b, 3c, 3d, not however the devices 36a, 36b, etc.)) may be additionally provided to support the heating process of the semi-conductor components 3a, 3b, 3c, 3d at station F, before and/or during any one or several of the above tests.

From station F the semi-conductor components 3a, 3b, 3c, 3d mounted in the housing 12a, 12b, 12c, 12d may then be—optionally—transported to one or more further stations—not shown here—where a corresponding semi-conductor component housing (for instance the housing 12a, with all the semi-conductor component 3a mounted in it)—together with further components (analog and/or digital computer circuits, processors, etc., and/or semi-conductor memory components, for instance PLAs, PALs, ROMs, RAMs, in particular SRAMs or DRAMs, etc.)—is connected to a corresponding electronic module 13, for instance a circuit board.

As is shown in FIG. 1b, the electronic module 13 (and thereby also the semi-conductor component 3a—connected with the electronic module 13 (mounted in a corresponding housing 12a)) may then be—optionally—transported to one or more further stations—for instance to station G shown in FIG. 1b.

At station G the semi-conductor components 3a—connected with module 13—may then be heated in a controlled fashion (for instance by using the above internal heating control device 50, 50'—mounted on the relevant semi-conductor component, or provided externally—) and/or subjected to various further test procedures, in particular to so-called module tests.

The voltages/currents and/or test signals required at station G for heating a corresponding semi-conductor component 3a—connected to module 13—by means of the above internal heating control devices 50, 50' (and/or for testing the corresponding semi-conductor component 3a and/or further components connected with module 13) are—as is more clearly described below—generated by several, for instance two or more control devices 46a, 46b (or alternatively by a single control device) and relayed via lines 49a, 49b to the electronic module 13 and thereby to corresponding connections of the relevant semi-conductor component 3a (and/or to the other components).

As an alternative, an appropriate (further) heating chamber 55 (in which—as is schematically represented in FIG. 1b—the above module 13 together with component 3a, and the devices 46a, 46b may be arranged (or for instance the module 13 together with the component 3a, and the devices 46a, 46b, etc.) may be additionally provided to support the heating process of the semi-conductor component 3a at station G, before and/or during any one or several of the above (further) tests.

Figure 2:
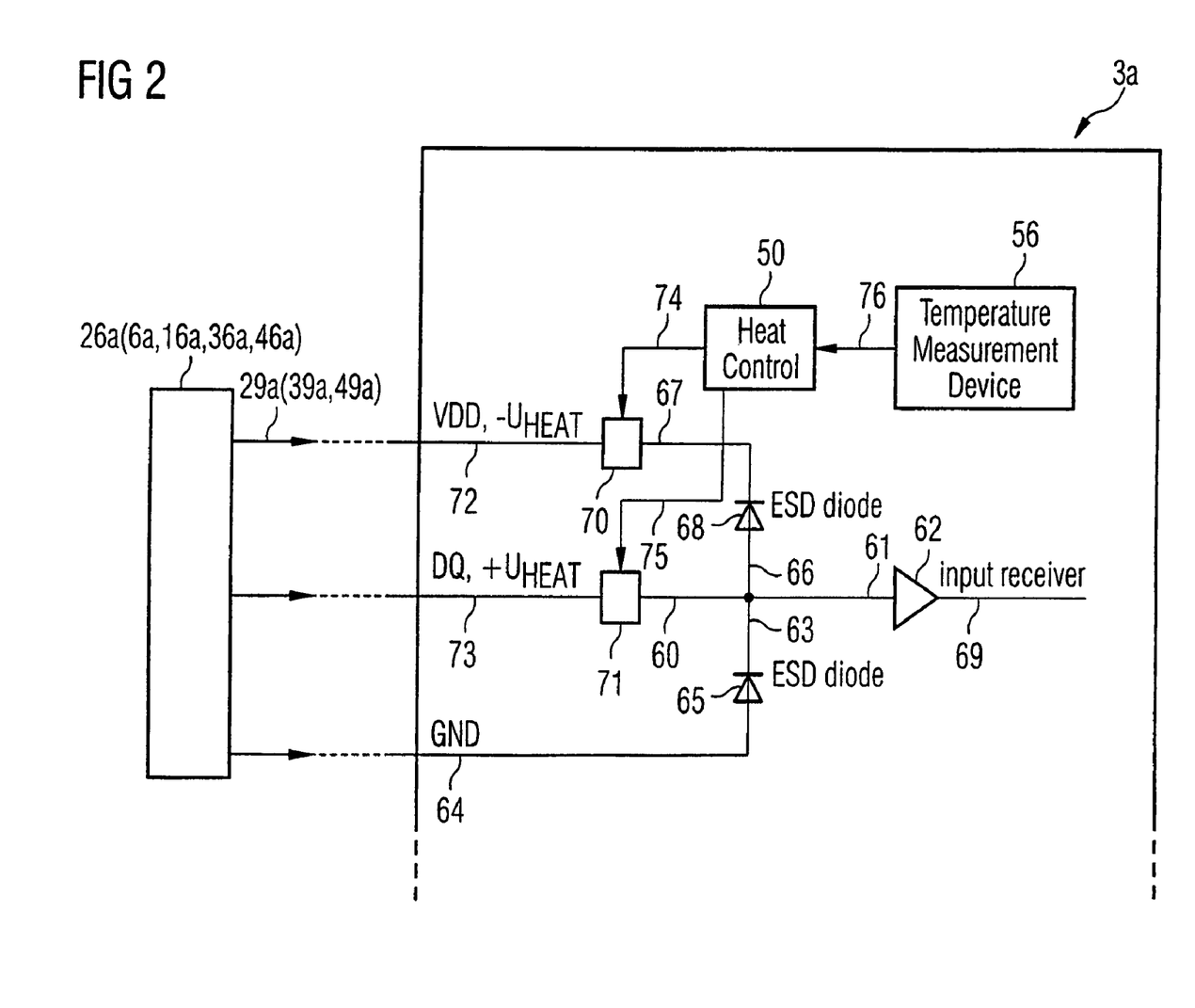
FIG. 2 shows a section of one of the semiconductor components shown in FIGS. 1a and 1b, with a temperature measuring device and an internal heating control device.

In FIG. 2 a schematic representation of a section of one of the semi-conductor components 3a, 3b, 3c, 3d shown in FIGS. 1a and 1b is shown, as well as—also schematically—the control device connected with it (here for instance the control device 26a shown in FIG. 1a (alternatively for instance the devices 6a, 16a, 36a, 46a shown in FIG. 1a and/or 1b)).

As is apparent from FIG. 2, the semi-conductor components 3a, 3b, 3c, 3d—shown in FIGS. 1a and 1b—in each case carry the internal heating control device 50—already mentioned above—and a temperature measuring device 56.

Furthermore the semi-conductor components 3a, 3b, 3c, 3d (here illustrated by way of an example by means of the semi-conductor component 3a shown in FIGS. 1a and 1b) have—corresponding to conventional semi-conductor components—numerous connections (so-called pads), for instance numerous data connections (DQ) (so-called data connection pads), numerous address connections (so-called address connection pads)—not shown here—numerous control connections (so-called control connection pads)—also not shown here—as well as one or more ground potential connections (ground potential pads—GND), and one or more supply voltage connections (VDD) (supply voltage connection pads), etc.

When the semi-conductor components 3a, 3b, 3c, 3d are installed into the corresponding housings 12a, 12b, 12c, 12d—as with conventional semi-conductor components—the relevant pads (i.e. the data connection pads, the address connection pads, the control connection pads, the potential connection pad, the supply voltage connection pad, etc.) are connected via corresponding bond wires with corresponding connections (so-called pins)—provided at each housing 12a, 12b, 12c, 12d—(i.e. the data connection pads with corresponding data connection pins, the address connection pads with corresponding address connection pins, the control connection pads with corresponding control connection pins, the ground potential connection pad with a corresponding ground potential connection pin, the supply voltage connection pad with a corresponding supply voltage connection pin, etc.).

Each of the above data connection pads (DQ) is—in order to be able to receive relevant useful external data during the "normal" operation of the semi-conductor component 3a (and—as is more closely described below—correspondingly similar to conventional semi-conductor components) connected via a corresponding line 60 to an input 61 of an input device 62 ("input receiver") allocated to each data connection pad (DQ).

The input 61 of the input data receiver 62 is connected—also correspondingly similarly to conventional semi-conductor components—via corresponding lines 63, 64 and an inter-connected protective diode 65, to the above ground potential connection pad (GND).

As is further apparent from FIG. 2, the input 61 of the input data receiver device 62 has been additionally connected (and—as is more closely described below—also correspondingly similar to conventional semi-conductor components) via corresponding lines 66, 67, and an inter-connected protective diode 68 to the above supply voltage connection pad (VDD).

According to FIG. 2—in contrast to conventional semi-conductor components—a switching means 70, for instance an appropriate transistor circuit including one or more transistors (of which the input is connected—via a line 72—with the supply voltage connection pad (VDD), and the output—via the above line 67—with the diode 68) has been connected in series at the semi-conductor component 3a, between the input 61 of the input data receiver 62, and the supply voltage connection pad (VDD) (more accurately: between the protective diode 68 and the supply voltage connection pad (VDD)).

Furthermore—and also in contrast to conventional semi-conductor components—at the semi-conductor component 3a, a switching means 71, for instance a corresponding transistor circuit—including one or more transistors—has been connected in series between the input 61 of the input data receiver 62, and the data connection pad (DQ) (more accurately between the line 60, and a line 73 connected with the data connection pad (DQ)).

Depending on the control signals emitted by the internal heating control device 50 to corresponding control lines 74, 75 and relayed to corresponding control inputs of the switching means 70, 71, the switching means 70, 71 can be brought into a "switched on" state by the internal heating control device 50 (in which the line 73 and the line 60, i.e. the data connection pad (DQ) and the input data receiver 62 (and/or the line 72, and the protective diode 68, i.e. the supply voltage connection pad (VDD) and the protective diode 68) are electrically connected), or brought into a "switched off" state (whereby the line 73 and the line 60, i.e. the data connection pad (DQ) and the input data receiver 62 (and/or the line 72, and the protective diode 68, i.e. the supply voltage connection pad (VDD) and the protective diode 68) are electrically disconnected from each other.

During the above "normal operation" of the semi-conductor component 3a, the switching means 70, 71—controlled by the internal heating control device 50—is "switched on" (and—in contrast to a "test" and/or "heated" operation (see below)—left in a continually "switched on" position).

When—correspondingly similar to conventional components—an appropriate positive supply voltage (VDD) is for instance applied to the supply voltage connection pad (VDD), and the ground potential connection pad (GND) is connected to ground, corresponding useful external data can be relayed to the semi-conductor component 3a—by applying corresponding "high logic" signals (for instance one at a positive voltage level Vp), or "low logic" signals (for instance one at ground voltage level) to the data connection pad (DQ) (whereby the following applies in particular: VDD≧Vp)

By means of the above protective diodes 68, 69, the "insides" of the semi-conductor component 3a—in particular the corresponding receiver 62 ("input receiver"), and the switching means directly or indirectly connected with the output 69 of the receiver 62 ("input receiver"), can be protected against too high and/or incorrectly polarized voltages.

For the above "test" and/or "heated" operation of the semi-conductor components 3a, the corresponding control devices 6a, 16a, 26a, 36a, 46a are—as shown in FIG. 2—connected via the corresponding lines 29a, 39a, 49a with corresponding connections, in particular with the above data connection (DQ), the above supply voltage connection (VDD) (and if needed also with a corresponding control connection and/or with the ground potential connection) of the semi-conductor component 3a (for instance—directly—with the corresponding data connection pad (DQ), the corresponding supply voltage connection pad (VDD) (and if needed, with the corresponding control connection pad, etc.) (cf. for instance the above stations A, C shown in FIG. 1a), or for instance indirectly via the corresponding data connection and supply voltage connection pins (and if needed, the corresponding control connection pin, etc.) (cf. for instance the stations F and G shown in FIGS. 1a and 1b).

In order to switch over from "normal" to "test" operation and/or "heated" operation (and/or vice versa) an appropriate control signal can for instance be applied by the corresponding control device 6a, 16a, 26a, 36a, 46a to one of the above control connections of the semi-conductor component 3a.

During the above "test" and/or "heated" operation—as is more clearly described below—the above internal heating control device 50 and/or the temperature measuring device 56 are in an "active" state.

The temperature measuring device 56 (for instance a conventional on-chip thermometer (or a corresponding device similarly constructed to this))—similarly used during a temperature-dependent normal self-refresh operation—delivers corresponding temperature measurement data (reflecting the current temperature $T_{ist}$ of the semi-conductor component 3a) to the internal heating control device 50 via one or more lines 76.

This device compares the temperature $T_{ist}$—measured by the temperature measuring device 56—with a nominal temperature $T_{soll}$—previously stored in the internal heating control device 50 and/or the semi-conductor component 3a (and pre-set or for instance if needed, subsequently externally adjustable by the control devices 6a, 16a, 26a, 36a, 46a).

As is also apparent from FIG. 2, and as is more clearly described below, a special voltage $U_{HEAT}$, differing from the above voltage VDD is applied—during "test" and/or "heated" operation—by the device 6a, 16a, 26a, 36a, 46a to the supply voltage connection, in particular to the supply voltage connection pad of the semi-conductor component 3a.

In addition—and as is also apparent from FIG. 2—a special voltage $U_{HEAT}$, differing from the above voltage Vp—is applied during "test" and/or "heated" operation by the device 6a, 16a, 26a, 36a, 46a to the data connection, in particular to the data connection pad of the semi-conductor component 3a.

The voltage $U_{HEAT}$—applied at the supply voltage connection—may for instance have an inverted polarity to that of the voltage VDD, applied to the supply voltage connection pad during the above "normal" operation (for instance, a suitable negative voltage $U_{HEAT}$—instead of a positive voltage VDD—may for instance by applied to the supply voltage connection of the control devices 6a, 16a, 26a, 36a, 46a).

If the internal heating control device 50 determines that the temperature $T_{ist}$ of the semi-conductor component 3a—measured by the temperature measuring device 56—lies above the nominal temperature $T_{soll}$, the internal heating control device 50—by applying appropriate signals to the above control lines 74, 75—causes the switching means 70, 71 to be "switched on" (whereby the line 73 and the line 60, and/or the line 72, and the line 67 are electrically connected).

The polarities and/or the voltage levels of the voltages $+U_{HEAT}, -U_{HEAT}$ applied by the control devices 6a, 16a, 26a, 36a, 46a to the data connection and/or the supply voltage are selected in such a way that the protective diode 68 (or—in case an appropriately selected potential has been applied to the ground potential connection (GND))—the protective diode 68, and the protective diode 65) are through-connected.

The current flowing through the protective diode 68 (and/or through the protective diode 68 and the protective diode 65) causes a corresponding heating of the protective diode 68 (and/or of the protective diode 68 and the protective diode 65), whereby the semi-conductor component 3a is also correspondingly heated.

If the internal heating control device 50 determines that the temperature $T_{ist}$ (in particular caused by the above heating of the semi-conductor components 3 due to the diodes)—measured by the temperature measuring device 56—rises above the nominal temperature $T_{soll}$, the internal heating control device 50 causes—by applying appropriate signals to the above control lines 74, 75—the switching means 70, 71 to be correspondingly "switched off".

Hereby line 73 and line 60, and/or line 72 and line 67 are electrically disconnected from each other, so that no more current flows through the diode(s) 68, 65, i.e. the semi-conductor component 3a can no longer be heated by the diodes, etc.

By means of the corresponding—and if necessary repeated—switching on and off of the switching device 70, 71 (and thereby of the diode(s) 68, 65) by the internal heating control device 50, the temperature of the semi-conductor component 3a is regulated at the above nominal temperature $T_{soll}$, i.e. an appropriate regulatory loop is created.

Figure 3:
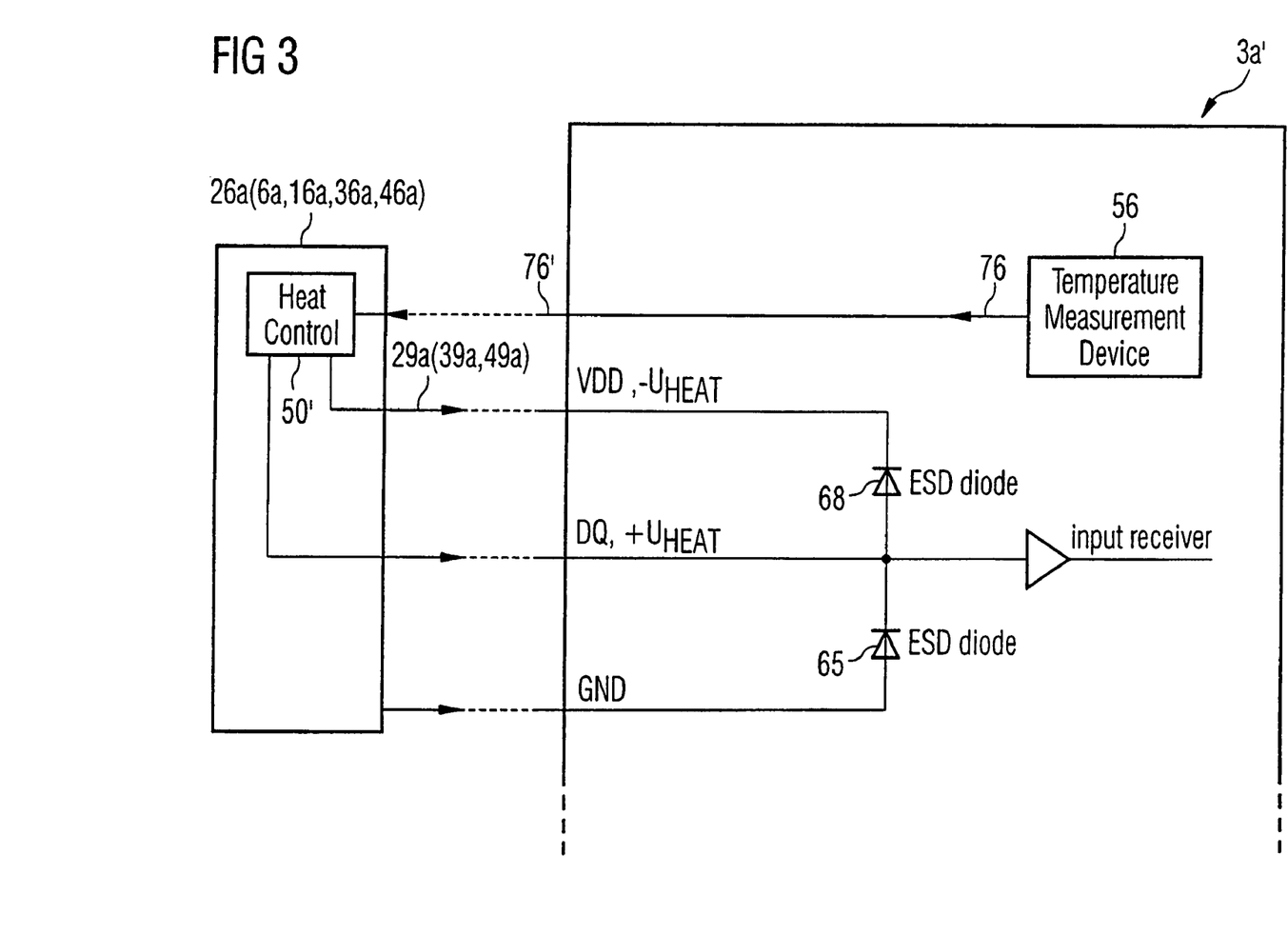
FIG. 3 shows a section of the semiconductor component shown in FIGS. 1a and 1b with a temperature measuring device and the control device that can be connected thereto.

In the alternative, preferred embodiment example shown in FIG. 3 an—internally—heated semi-conductor component 3a' (and a control device 26a (and/or 6a, 16a, 36a, 46a) connected with it)) has been correspondingly identically constructed and arranged, and the semi-conductor component 3a' is correspondingly identically heated—by using the protective diode 68 (and/or the protective diodes 65, 68)—as described above by means of FIG. 2 in relation to the semi-conductor component 3a, except that function of the internal heating control device 50 mentioned above—and provided on the component 3a itself—is assumed by the control device 26a (and/or 6a, 16a, 36a, 46a), connected with the semi-conductor component 3a' (cf. also the internal heating control device 50' shown in FIG. 3, provided externally to the conductor component 3a' in the control device 26a).

As is apparent from FIG. 3, the temperature measurement data produced by the temperature measuring device 56 via the line 76, and a line 76' connected with it, is made available to the control device 26a (and/or to the internal heating control device 50' arranged on it).

If the internal heating control device 50' determines that the temperature $T_{ist}$ of the semi-conductor component 3a'—measured by the temperature measuring device 56—lies below the desired nominal temperature $T_{soll}$, it is ordered by the internal heating control device 50' that appropriate heating voltages $+U_{HEAT}, -U_{HEAT}$ are applied via the above lines 29a (39a, 49a), for instance to the above data connection, and the supply voltage connection of the semi-conductor component 3a' (or to various corresponding connections, which for instance differ from the above address connection, etc.)

These voltages have been so selected—as described above—that the protective diode 68 (or—in case a correspondingly selected potential has been supplied to the ground potential-connection (GND)—the protective diode 68 and the protective diode 65)) are through-connected.

The current flowing through the protective diode 68 (and/or the protective diode 68 and the protective diode 65) causes a corresponding heating of the protective diode 68 (and/or the protective diode 68 and the protective diode 65), whereby the semi-conductor component 3a' is also correspondingly heated.

If the internal heating control device 50' determines that the measured temperature $T_{ist}$—measured by the temperature measuring device 56—(and in particular caused by the above heating of the semi-conductor component 3a' by the diode(s)), is rising above the nominal temperature $T_{soll}$, the internal heating control device 50' orders the above heating voltages $+U_{HEAT}, -U_{HEAT}$—for instance applied to the data connection and the supply voltage connection of the semi-conductor component 3a'—to be switched "off" again.

Then no further current flows through the diode(s) 68, 65, with result that the semi-conductor component 3a' cannot be further heated by the diode, etc.

By means of the appropriate—and if necessary repeated—switching on and off of the heating voltages $+U_{HEAT}, -U_{HEAT}$, i.e. an appropriate regulatory loop is created, and the semi-conductor component 3a' is thereby regulated—as is correspondingly illustrated above in relation to FIG. 2—at the above nominal temperature $T_{soll}$.

Alternatively, the exact level of the heating voltages $+U_{HEAT}, -U_{HEAT}$ may also be correspondingly varied in each case by the internal heating control device 50', so that the semi-conductor component 3a' is—depending on the component temperature $T_{ist}$ measured in each case —correspondingly heated more or less (whereby an even more accurate and/or quicker regulation of the temperature $T_{ist}$ of the semi-conductor component 3a' can be achieved).

As already mentioned above (and as illustrated in FIG. 1a and/or 1b), the semi-conductor component 3a (and/or the semi-conductor component 3a') may be installed into an appropriate heating chamber 51, 52, 53, 54, 55 during the above "test" and/or "heating" operation.

Inside the heating chambers 51, 52, 53, 54, 55 relatively pronounced non-homogeneous temperature divisions may occur in part (for instance temperatures lying above and below the nominal chamber temperature $T_{k,soll}$, between a minimum temperature Tmin and a maximum temperature Tmax, whereby the following applies: Tmin<$T_{k,soll}$<Tmax).

Advantageously the nominal chamber temperature $T_{k,soll}$ for each heating chamber 51, 52, 53, 54, 55 has been so selected and/or adjusted that the maximum temperature Tmax actually occurring in the heating chamber 51, 52, 53, 54, 55 is lower and/or somewhat lower (for instance between 0° C. and 25° C., in particular for instance between 5° C. and 10° C., etc. lower), than the above nominal semi-conductor component temperature $T_{soll}$ provided for the semi-conductor component 3a and (finely) regulated by the internal heating control device 50, 50'.

REFERENCE NUMBERS 3a semi-conductor component
3a' semi-conductor component
3b semi-conductor component
3c semi-conductor component
3d semi-conductor component
6a control device
6b control device
7 slicing machine
8 probe card
9a contact pin
9b contact pin
11a carrier
11b carrier
11c carrier
11d carrier
12a housing
12b housing
12c housing
12d housing
13 electronic module
16a control device
16b control device
18 probe card
19a contact pin
19b contact pin
26a control device
26b control device
29a line
29b line
36a control device
36b control device
39a line
39b line
46a control device
46b control device
49a line
49b line
50 internal heating control device
50' internal heating control device
51 heating chamber
52 heating chamber
53 heating chamber
54 heating chamber
55 heating chamber
56 temperature measuring device
60 line
61 input
62 input data receiver
63 line
64 line
65 protective diode
66 line
67 line
68 protective diode
69 output
70 switching means
71 switching means
72 line
73 line
74 control line
75 control line
76 line
76' line

What is claimed is:

1. A semi-conductor component, comprising a device on the semi-conductor component for heating the semi-conductor component, comprising:
   a component heating device to heat the semi-conductor component, the device comprising a heating element which can be heated by the current flowing through the heating element;
   a control and/or regulatory device for controlling and/or regulating the current flowing through the heating element such that the temperature of the semi-conductor component essentially corresponds with a predetermined nominal temperature, wherein
   the heating element is a ESD diode connected with a data receiver device of the semi-conductor component, the ESD diode being operated in high-resistance backward direction in a working mode of the semi-conductor component for protecting the data receiver device against high currents in the working mode, the ESD diode being operated in low-resistance forward direction in the heating mode for heating the semi-conductor component.

2. The semi-conductor component according to claim 1, which comprises a temperature measuring device.

3. The semi-conductor component according to claim 1, in which the heating element is an ESD protective diode.

4. The semi-conductor component according to claim 1, in which, during a heating mode of the semi-conductor component, the element is used as a heating element and, during a working mode of the semi-conductor component as a protective element for protection against over-high and/or incorrectly polarized voltages.

5. The semi-conductor component according to claim 4, in which the heating element is connected in a conductive orientation during the heating mode, and in a non-conductive orientation during the working mode.

6. A system, comprising
   a semi-conductor component having a device on the semi-conductor component for heating the semi-conductor component, the device comprising a heating element which can be heated by the current flowing through the heating element;

a control and/or regulatory device for controlling and/or regulating the current flowing through the heating element such that the temperature of the semi-conductor component essentially corresponds with a predetermined nominal temperature, wherein the heating element is a ESD diode connected with a data receiver device of the semi-conductor component, the ESD diode being operated in high-resistance backward direction in a working mode of the semi-conductor component for protecting the data receiver device against high currents in the working mode, the ESD diode being operated in low-resistance forward direction in the heating mode for heating the semi-conductor component; and an external device on an exterior of the semi-conductor component.

7. The system according to claim 6, in which the external device is a control and/or regulatory device for controlling and/or regulating the heating of the semi-conductor component.

8. The system according to claim 6, in which the control and/or regulatory device controls or regulates the current flowing through the heating element.

9. A process for heating a semi-conductor component in a heating mode of the semi-conductor component, comprising:

heating the semi-conductor component by using a component heating device, the device comprising a hating element which can be heated by the current flowing through the heating element; and varying the current flowing through the heating element such that the temperature of the semi-conductor component essentially corresponds with a pre-determined nominal temperature, wherein the heating element is a ESD diode with a first input connected with a voltage supply connection of the semiconductor component, and with a second input connected with a data receiver device and a data connection of the semi-conductor component, the ESD diode being operated in high-resistance backward direction in a working mode of the semi-conductor component for protecting the data receiver device against high currents in the working mode, the ESD diode being operated in low-resistance forward direction in the heating mode for heating the semi-conductor component.

10. The process according to claim 9, whereby the device comprises a control and/or regulatory device, which controls and/or regulates the heating process.

11. The process according to claim 9, whereby a control and/or regulatory device is provided outside the semiconductor component for controlling and/or regulating the heating process.

12. The process according to claim 11, in which a control and/or regulatory device is arranged and adapted such that it can be used as a control and/or regulatory device for performing the process.

* * * * *